United States Patent
Banno et al.

(10) Patent No.: US 7,354,486 B2
(45) Date of Patent: Apr. 8, 2008

(54) PROCESS FOR PRODUCING GE-ADDED NB₃AL BASE SUPERCONDUCTING WIRE MATERIAL

(75) Inventors: Nobuya Banno, Tsukuba (JP); Takao Takeuchi, Tsukuba (JP)

(73) Assignee: National Institute for Materials Science, Ibaraki (JP)

( * ) Notice: Subject to any disclaimer, the term of this patent is extended or adjusted under 35 U.S.C. 154(b) by 130 days.

(21) Appl. No.: 10/564,482

(22) PCT Filed: Jul. 15, 2004

(86) PCT No.: PCT/JP2004/010422

§ 371 (c)(1),
(2), (4) Date: Feb. 24, 2006

(87) PCT Pub. No.: WO2005/006354

PCT Pub. Date: Jan. 20, 2005

(65) Prior Publication Data

US 2006/0180246 A1     Aug. 17, 2006

(30) Foreign Application Priority Data

Jul. 15, 2003  (JP)  .............................. 2003-274858

(51) Int. Cl.
    *H01L 39/24*   (2006.01)
(52) U.S. Cl. .................... 148/98; 29/599; 29/825; 174/125.1
(58) Field of Classification Search .................... None
    See application file for complete search history.

(56) References Cited

U.S. PATENT DOCUMENTS

| | | | |
|---|---|---|---|
| 3,694,274 A * | 9/1972 | Giorgi et al. | 148/430 |
| 3,713,898 A * | 1/1973 | Giorgi et al. | 419/29 |
| 4,018,942 A * | 4/1977 | Muller et al. | 148/98 |
| 4,223,434 A * | 9/1980 | Wang et al. | 29/599 |
| 5,362,331 A | 11/1994 | Tada et al. | |
| 6,372,054 B1 * | 4/2002 | Kikuchi et al. | 148/98 |
| 6,376,099 B1 * | 4/2002 | Inoue et al. | 428/615 |
| 6,508,889 B2 * | 1/2003 | Kikuchi et al. | 148/98 |
| 6,570,096 B2 * | 5/2003 | Takeuchi et al. | 174/125.1 |

(Continued)

FOREIGN PATENT DOCUMENTS

JP      04-019918      1/1992

(Continued)

OTHER PUBLICATIONS

Nobuya Banno et al., "Superconducting Property of Nb₃(Al, Ge) Conductors Prepared by Diffusion Process", IEEE Transactions on Applied Superconductivity, vol. 14, No. 2, pp. 967-970, Jun. 2004.

*Primary Examiner*—John P. Sheehan
(74) *Attorney, Agent, or Firm*—Wenderoth, Lind & Ponack, L.L.P.

(57) ABSTRACT

A composite multi-core wire rod in which a plurality of Al alloy wires containing 15 at % to 40 at % of Ge are arranged in Nb matrix at a core diameter of 2 μm to 20 μm is subjected to heating for at least five hours at a temperature ranging from 1300° C. to 1600° C.; and additionally heating at a temperature ranging from 650° C. to 900° C.

1 Claim, 5 Drawing Sheets

U.S. PATENT DOCUMENTS

2002/0037815 A1 3/2002 Takeuchi et al.

FOREIGN PATENT DOCUMENTS

| JP | 06-111645 | | 4/1994 |
|---|---|---|---|
| JP | 09-204826 | * | 8/1997 |
| JP | 2001-338542 | | 12/2001 |
| JP | 2002-033025 | | 1/2002 |

* cited by examiner

US 7,354,486 B2

PROCESS FOR PRODUCING GE-ADDED NB₃AL BASE SUPERCONDUCTING WIRE MATERIAL

TECHNICAL FIELD

The present invention relates to a method of producing a Ge-added $Nb_3Al$-based superconducting wire.

BACKGROUND ART

Great expectations have risen for application of a Ge-added $Nb_3Al$-based superconducting wire as a wire which can be used in strong magnetic fields of 21 T or higher because it has higher upper critical magnetic field than practically used $Nb_3Sn$ superconducting wires.

As to production method of a Ge-added $Nb_3Al$-based superconducting wire, it is general to directly diffuse Nb together with Al or Al alloy, and high critical magnetic field can be obtained by simply heating at elevated temperatures. However, such heat treatment at elevated temperatures makes resultant crystal particles bulky, and critical current density practically required cannot be realized. Furthermore, since a practical strong magnetic field magnet is requested to realize high transport current from the view point of protection from quenching or the like, a practical wire should essentially have not only high critical current density but also high transport current.

For improving characteristics of a Ge-added $Nb_3Al$-based superconducting wire, two approaches have been proposed heretofore.

In the first approach, heat treatment is conducted at low temperature so as to prevent crystal particles from becoming bulky, while a diffusing pair of Nb and Al alloy, namely the size of alloy core is reduced as small as possible, for example, less than or equal to 1 μm to destabilize a phase which is an intermediate compound, in order to improve the stoichiometry of an Al5 phase which is a superconducting phase.

In the second approach, crystal particles are prevented from becoming bulky through short retention at an elevated temperature at which the Al5 phase of stoichiometric composition is stable, followed by quenching if necessary. Also in this approach, it is preferred to reduce the size of the diffusing pair of Nb and Al. This allows Nb and Al to react in a very short time.

As described above, in the conventional techniques, it is believed that the size of the diffusing pair of Nb and Al should be as small as possible.

However, workability of Nb—Al—Ge composite material is very poor, and it is very difficult to incorporate a diffusing pair of fine Nb and Al alloy in a precursor wire. An Al-dissolved material containing an amount of Ge required to sufficiently improve characteristics exhibits a typical eutectic structure, and is so difficult to be processed that a small work may cause a crack.

Therefore, it is the current state of the art that manufacture of a practical wire is difficult in the conventional approach of reducing the size of the diffusing pair of Nb and Al alloy.

The present invention was devised in consideration of the above circumstance, and it is an object of the present invention to provide a method of producing a Ge-added $Nb_3Al$-based superconducting wire capable of realizing a practical Ge-added $Nb_3Al$-based superconducting wire for use in strong magnetic fields having high critical current density and transport current in magnetic field regions of 21 T or higher.

BEST MODE FOR CARRYING OUT THE INVENTION

Figure 1:
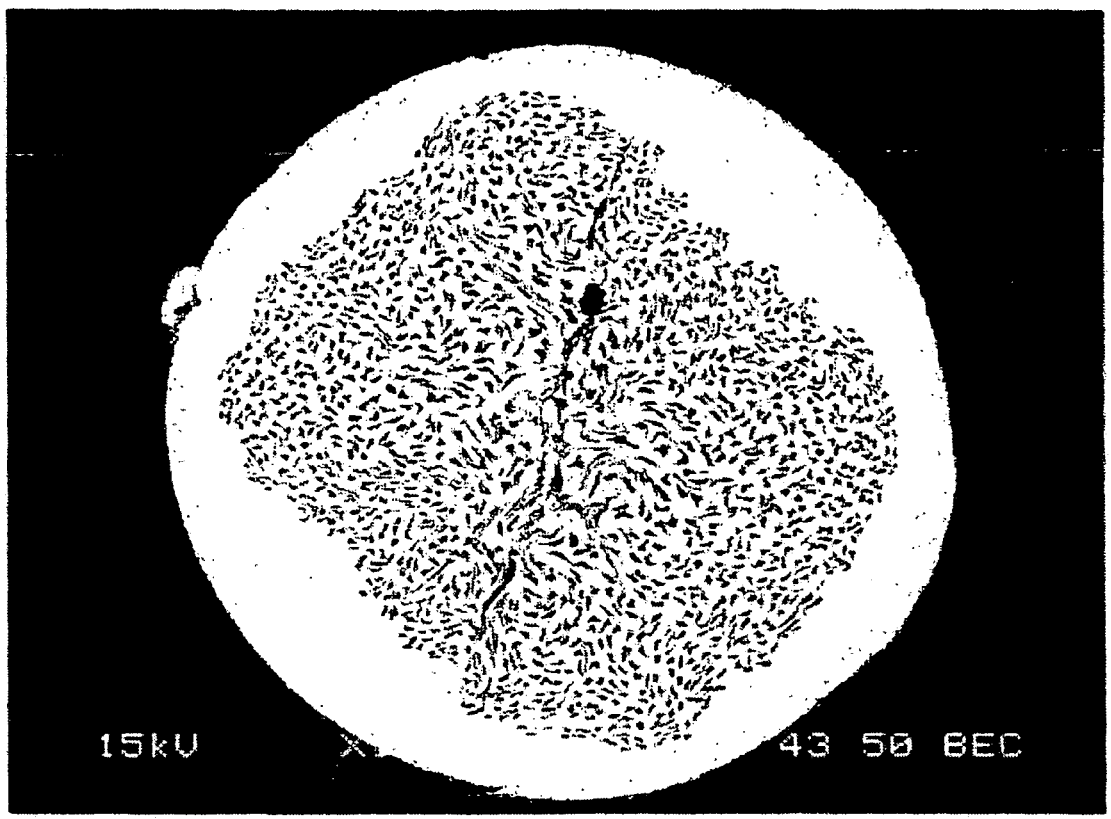
FIG. 1 is a photograph of a cross section of a composite multi-core wire produced in Example 1.

In order to solve the above problems, the present invention provides a method of producing a Ge-added $Nb_3Al$-based superconducting wire comprising the steps of preparing a composite multi-core wire in which a plurality of Al alloy cores containing 15 at % to 40 at % of Ge are arranged in Nb matrix at a core diameter of 2 μm to 20 μm; heating for at least five hours at a temperature ranging from 1300° C. to 1600° C.; and additionally heating at a temperature ranging from 650° C. to 900° C.

The method of producing a Ge-added $Nb_3Al$-based superconducting wire of the present invention is based on an opposite idea to the conventional idea that the core diameter of Al alloy core, namely the size of diffusing pair is increased, and heat treatment is conducted at a relatively high temperature for a long time.

Heretofore, it has been considered that heat treatment at not less than 1300° C. for a retention time of at least five hours makes crystal particles bulky, making it difficult to obtain high critical current density. When the core diameter in Nb matrix of the Al alloy core containing 15 at % to 40 at % of Ge was increased in the range of 2 μm and 20 μm, and heat treatment was conducted in the temperature range of 1300° C. to 1600° C. with a retention time of at least five hours, it was proved to be possible to stably obtain a peak effect that critical current density significantly increases in high magnetic field region of 21 T or higher, and a Ge-added $Nb_3Al$-based superconducting wire specialized in high magnetic current density was obtained. And by additionally heating at a temperature ranging from 650° C. to 900° C. after heating at a temperature ranging from 1300° C. to 1600° C. with a retention time of at least five hours, the Al5 phase which is a superconducting phase is atomically ordered and the intensity of critical current density becomes 300 A/mm² at 4.2 K and 21 T, and 265 A/mm² at 22 T. These values are much larger than values for $Nb_3Sn$ superconducting wires now practically available.

Furthermore, in the method of producing a Ge-added $Nb_3Al$-based superconducting wire according to the present invention, the high cooling speed is not always necessary so that it is possible to increase cross section area of a wire relatively easily and thus is able to obtain high transport current. Additionally, since quenching is no longer necessary, it becomes possible to employ "wind&react method" which is a practical production method of coil in which heating is conducted after winding a precursor wire in coil form.

In the method of producing a Ge-added $Nb_3Al$-based superconducting wire according to the present invention, Ge concentration in Al alloy is specified in the range of 15 at % to 40 at %. When concentration of Ge falls within this range, high magnetic field characteristic and critical temperature of the $Nb_3Al$-based superconducting wire are improved, and a balance in hardness is achieved between Al alloy core and Nb which is critical in wire-drawing process.

Core diameter of Al alloy core is in the range of 2 μm to 20 μm. This is because if the core diameter is less than 2 μm, the critical current density decreases, while if the core diameter is more than 20 μm, volume of tetragonal compound increases due to heat treatment and critical current density decreases.

The temperature of heat treatment ranges from 1300° C. to 1600° C. At temperatures less than 1300° C., stoichiometry of the Al5 phase which is a superconducting phase significantly decreases, whereas at temperatures more than 1600° C., crystal particles become bulky due to long-time heat treatment so that critical current density on the side of low magnetic field significantly decreases.

The heat treatment time is at least five hours. This is for achieving homogenization of the Al5 phase.

The temperature range for additional heat treatment is from 650° C. to 900° C. This temperature range provides atomic ordering of the Al5 phase.

According to the method of producing a Ge-added $Nb_3Al$-based superconducting wire of the present invention, it is possible to realize a practical Ge-added $Nb_3Al$-based superconducting wire for strong magnetic fields having high critical current density and transport current in magnetic field regions of 21 T or higher.

In the following, the method of producing a Ge-added $Nb_3Al$-based superconducting wire of the present invention will be explained in more detail by way of examples.

EXAMPLE 1

A Nb pipe having an outer diameter of 20 mm and an inner diameter of 18 mm was charged with Al powders and Ge powers in an atomic ratio of 3:1, and a composite material having an outer diameter of about 4.2 mm was prepared using a groove roller and a cassette roller dice. Seven pieces of the composite material were inserted into 7-core Nb rod, and subjected to wire-drawing to about 0.87 mm in outer diameter. Vickers hardness of the Nb matrix and the Al—Ge alloy core at this time were respectively 110 kgf/mm$^2$ and 105 kgf/mm$^2$, so that balance in hardness was achieved. Then, 241 of the composite wire were inserted into a Nb pipe having an outer diameter of 20 mm and an inner diameter of 16 mm and the composite material wire was drawn to finally obtain an elongated composite multi-core wire having Nb/Al—Ge diffusion pairs in which an outer diameter is 0.87 mmφ, the number of Al—Ge alloy core is 7×241, a core diameter of Al—Ge alloy core is about 8 μm. FIG. 1 is a photograph of a cross section of the elongated composite multi-core wire.

Figure 2:
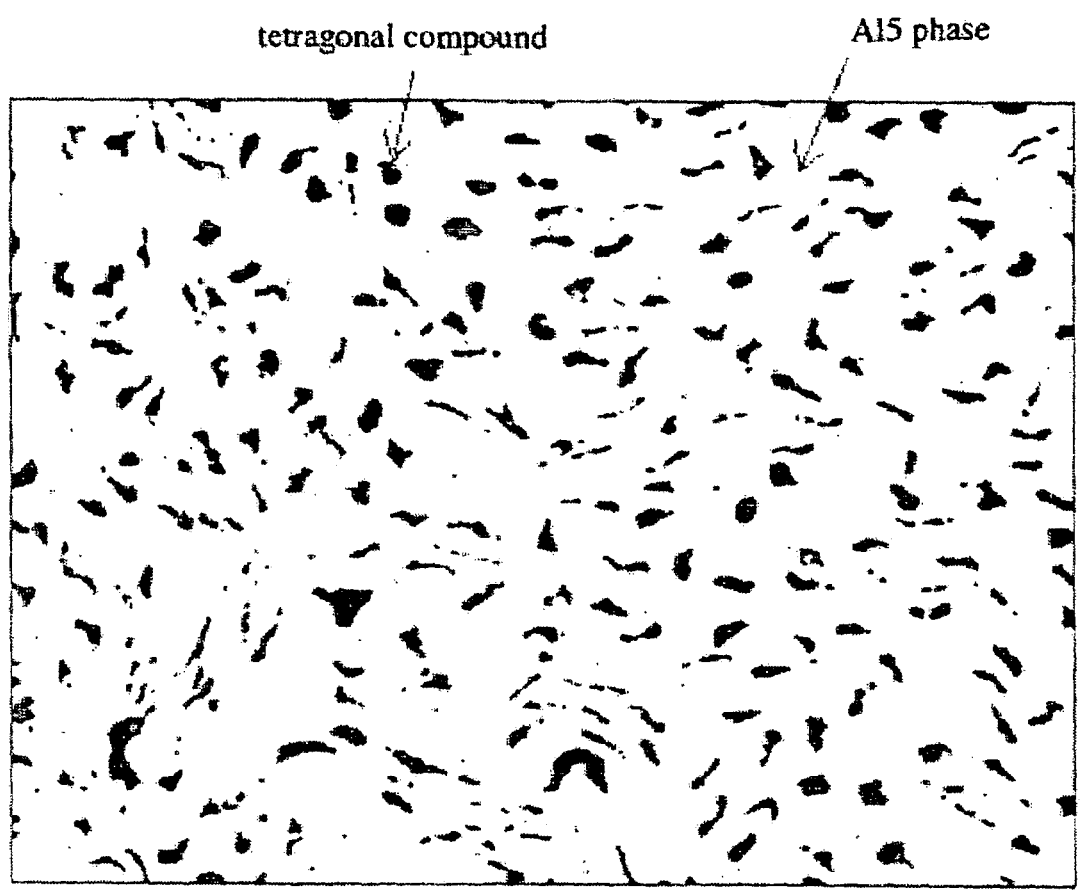
FIG. 2 is a photograph of a traverse section of a tape produced in Example 1 after heat treatment.

This composite multi-core wire was subjected to rolling to obtain a plurality of tapes in which a core diameter of Al—Ge alloy core falls within the range of about 1 μm to 8 μm. Next the resultant tape was subjected to heat treatment at 1400° C. for 1 to 10 hours. A fine structure shown in FIG. 2 was formed in a traverse section. The window width was 0.24 mm. EDX measurement and X-ray diffraction measurement revealed that the white part in FIG. 2 was an Al5 superconducting phase and the black part was a tetragonal compound phase.

A critical temperature $T_c$ directly after heating the tape having a core diameter of Al—Ge alloy core of about 8 μm at 1400° C. for 7 hours was 17.7 K, and formation of superconducting phase was observed. As a result of additional heating of the tape at 800° C. for 10 hours, $T_c$ was rose to 18.1 K. This may be ascribed to improvement in atomic order of crystals of the Al5 phase.

Figure 3:
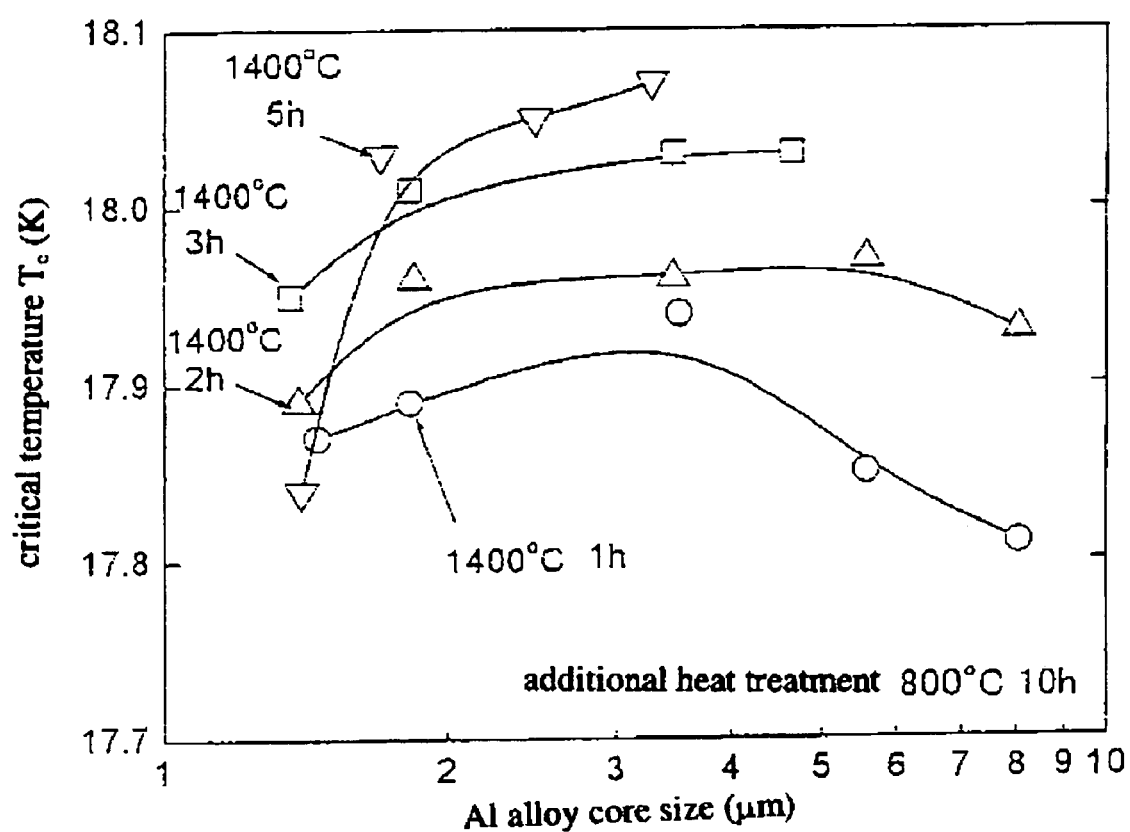
FIG. 3 is a graph showing dependency of critical temperature $T_c$ on core diameter of Al—Ge alloy in Example 1.

FIG. 3 is a graph showing dependency of $T_c$ on Al—Ge alloy core diameter in the tapes after additional heating. As can be see from FIG. 3, in order to raise $T_c$, it is necessary to select the core diameter of Al—Ge alloy core at 2 μm or more. Furthermore, FIG. 3 shows that the heat treatment time should be at least five hours.

Figure 4:
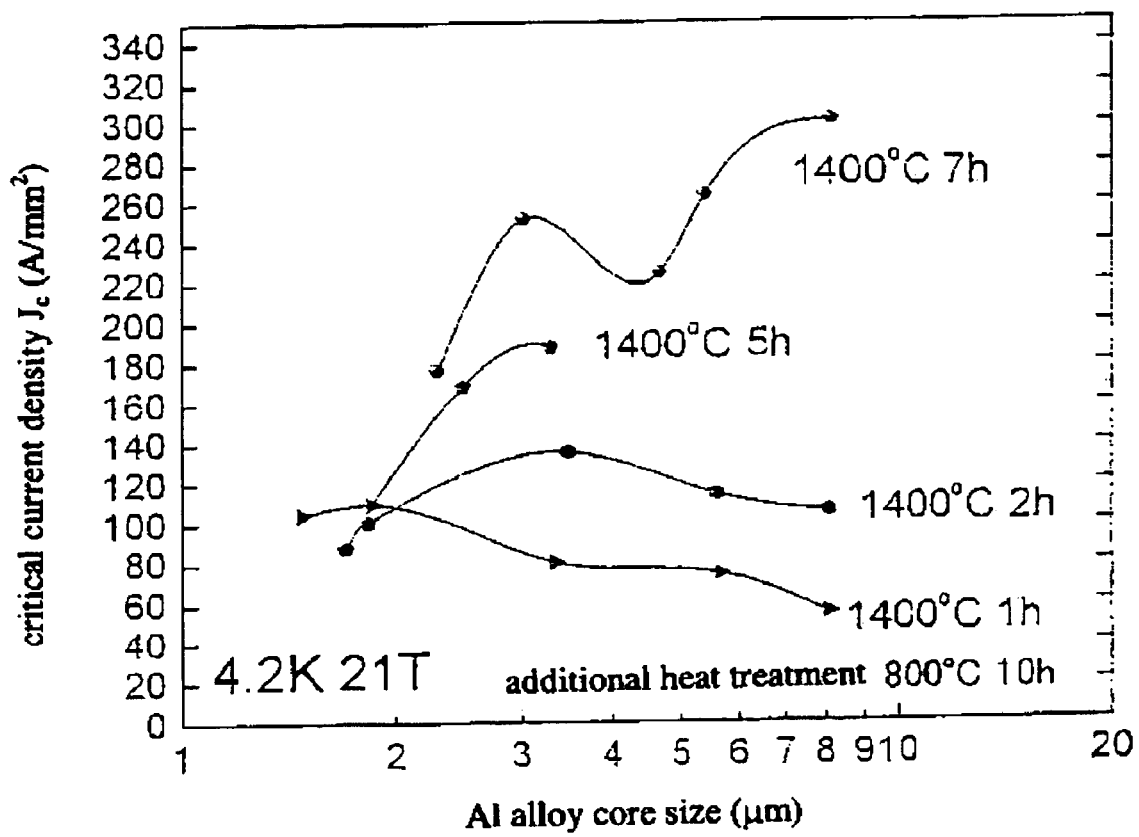
FIG. 4 is a graphs showing dependency of critical current density $J_c$ on core diameter of Al—Ge alloy in Example 1.

FIG. 4 is a graph showing dependency of critical current density $J_c$ on core diameter. As can be seen from FIG. 4, in order to obtain excellent $J_c$ as well as $T_c$, it is necessary to select the core diameter of Al—Ge alloy core at 2 μm or more, and the heat treatment time should be at least five hours.

Figure 5:
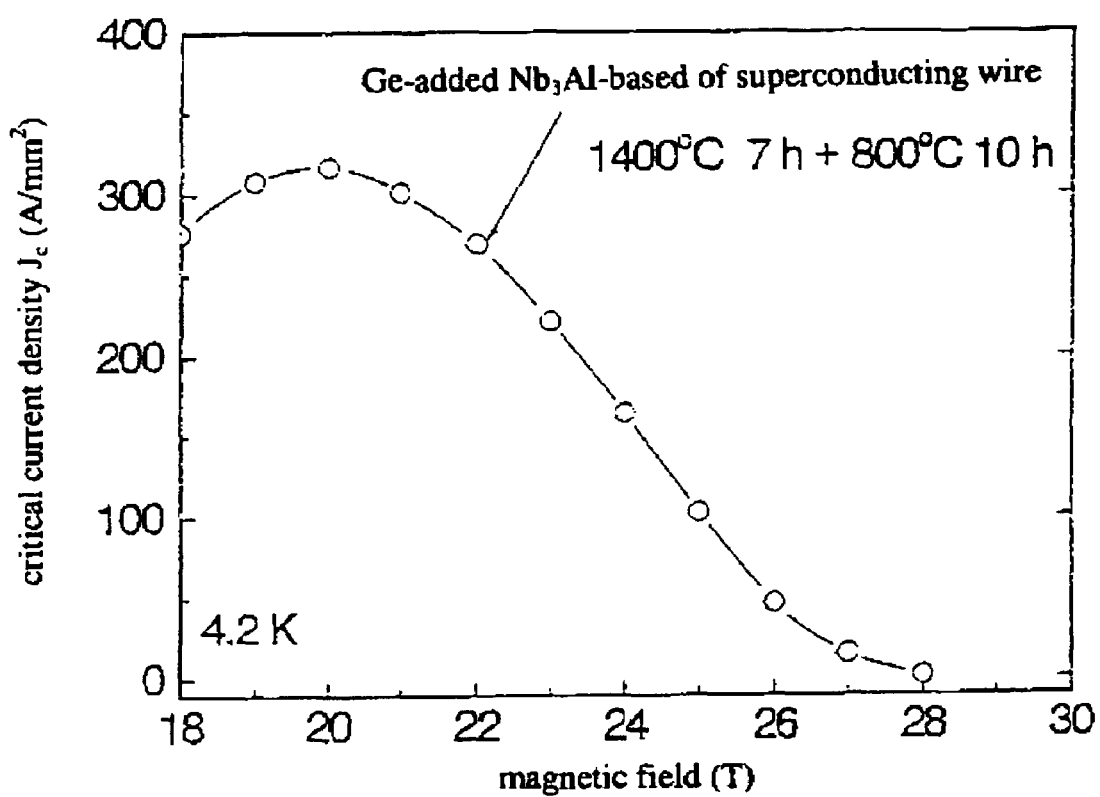
FIG. 5 is a graph showing dependency of critical current density $J_c$ on magnetic field in Example 1.

FIG. 5 is a graph showing dependency of of $J_c$ on magnetic field of the tape having subjected to heat treatment at 1400° C. for 7 hours followed by additional heat treatment at 800° C. for 10 hours and having a core diameter of Al—Ge alloy core of 8 μm. A peak effect that $J_c$ is larger on the high magnetic field side was observed. $J_c$ was 300 A/mm$^2$ at 4.2 K and 21 T, and 265 A/mm$^2$ at 22 T. When the temperature of heat treatment was 1200° C., about 30 A/mm$^2$ at most was obtained even at 17 T, and on the further higher magnetic fields, the characteristics were much deteriorated.

EXAMPLE 2

As is the same with Example 1, a composite multi-core wire having an outer diameter of about 2 mm, the number of Al—Ge alloy core of 7×241×15 and a core diameter of Al—Ge alloy core of about 4 μm was prepared. This composite multi-core wire was subjected to heat treatment at 1400° C. for 7 hours, followed by additional heat treatment at 800° C. for 10 hours. As a result, a critical current at 21 T exceeded 300 A.

From the Examples 1 and 2, it was confirmed that a Ge-added $Nb_3Al$-based superconducting wire exhibiting not only high critical current density but also high critical current can be prepared.

Of course, the present invention is not limited to examples as described above. It goes without saying that as to the details, various forms are acceptable.

INDUSTRIAL APPLICABILITY

A Ge-added $Nb_3Al$-based superconducting wire produced by the method of producing a Ge-added $Nb_3Al$-based superconducting wire of the present invention exhibits high critical current density and high transport current in high magnetic field region of 21 T or higher, making it possible to realize a magnet generating such a high magnetic filed that can never be achieved in conventional techniques. Stronger magnetic field of NMR magnet will be promoted. Stronger magnetic field of a multi-purpose high magnetic field magnet for physical property and the multi-purpose high magnetic field magnet with compact size will be promoted.

The invention claimed is:

1. A method of producing a Ge-added $Nb_3Al$-based superconducting wire comprising the steps of preparing a composite multi-core wire in which a plurality of Al alloy wires containing 15 at % to 40 at % of Ge are arranged in Nb matrix at a core diameter of 2 μm to 20 μm; heating for at least five hours at a temperature ranging from 1300° C. to 1600° C.; and additionally heating at a temperature ranging from 650° C. to 900° C.

* * * * *